(12) United States Patent
Lai

(10) Patent No.: US 6,259,185 B1
(45) Date of Patent: Jul. 10, 2001

(54) METALLIZATION FOR HIGH POWER HANDLING IN A SURFACE ACOUSTIC WAVE DEVICE AND METHOD FOR PROVIDING SAME

(75) Inventor: Shouliang Lai, Tempe, AZ (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/204,337

(22) Filed: Dec. 2, 1998

(51) Int. Cl.[7] .................................................. H01L 41/04

(52) U.S. Cl. ........................................ 310/313 B; 310/364

(58) Field of Search ................................. 310/364, 313 B

(56) References Cited

U.S. PATENT DOCUMENTS

| | | | |
|---|---|---|---|
| 4,445,066 | * 4/1984 | Nishiyama et al. | 310/364 |
| 4,775,814 | * 10/1988 | Yuhara et al. | 310/313 R |
| 5,144,185 | * 9/1992 | Yuhara et al. | 310/313 B |
| 5,773,917 | * 6/1998 | Satoh et al. | 310/364 |
| 5,909,156 | * 6/1999 | Nishihara et al. | 333/193 |

FOREIGN PATENT DOCUMENTS

| | | |
|---|---|---|
| 0 524 754 | * 1/1993 | (EP) . |
| 5-090268 | * 4/1993 | (JP) . |
| 10-093368 | * 4/1998 | (JP) . |
| 11-163661 | * 6/1999 | (JP) . |

OTHER PUBLICATIONS

Kimura et al. "High Power–Durable and Low Loss Single–Crystalline Al/Ti Electrodes for RF SAW Devices." 1998 Ultrasonics Symposium. Jul. 1998. pp 315–318.*

"Improved Power Durability Of Surface Acoustic Wave Filters For An Antenna Duplexers", T. Nishihara, H. Uchishiba, O. Ikata and Y. Satoh, Jpn. J. Appl. Phys, vol. 34 (May 1995), Pt. 1, No. 5B, pp. 2688–92.

"Sputtered Al–Ti Electrodes For High Power Durable Saw Devices", J. Yamata, N. Hosaka, A. Yuhara , A. Iwama, 1998 IEEE Ultrasonics Symposium Proceedings, pp. 285–90.

"Ti–Added Al Electrodes on LiTaO3 36° Y–X Substrates For High Power Surface Acoustic Wave Devices I", Y. Ota, N. Hosaka, A. Yuhara, J. Yamata, Jpn. J. Appl. Phys, vol. 32 (May 1993), Pt. 1, No. 5B, pp. 2351–4.

"High Power–Durable RF Band Saw Filters Using Single–Crystal Al/Ti Electodes Grown on 64° Y–X LiNbO3 Substrates", N. Kimura, M. Nakano, K. Sata, IEE Electronic Letters Online No.:19980105, Oct. 30, 1997.

"Intermetallic Compounds Of Al and Transition Metals: Effect Of Electromigration In 1–2$\mu$M–Wide Lines", J. Howard, J. White, J. Appl. Phys (Jul. 1978), vol. 49, No. 7, No. 5B, pg. 4083–93.

"Structure Engineering For Hillock–Free Pure Aluminum Sputter Deposition For Gate And Source Line Fabrication In Active–Matrix Liquid Crystal Displays", A. Voutsas, Y. Hibino, J. Vac. Sci. Technol. A, vol. 16, No. 4, Jul./Aug. 1998, pg. 2668–77.

* cited by examiner

Primary Examiner—Nestor Ramirez
Assistant Examiner—Peter Medley

(57) ABSTRACT

A surface acoustic wave device with electrodes having a metallization of a first layer of substantially pure titanium and a second layer of an alloy of aluminum and titanium. The titanium comprises about 0.1% to about 1.0% by weight of the alloy with aluminum substantially comprising the remainder of the alloy. The titanium of the first layer provides good adhesion and preferential Al(111) grain orientation for the second layer. The titanium of the second layer provides good mechanical strength for improved power handling while the aluminum maintains high electrode conductivity. Small grain structure in the metallization further improves mechanical strength.

17 Claims, 3 Drawing Sheets

METALLIZATION FOR HIGH POWER HANDLING IN A SURFACE ACOUSTIC WAVE DEVICE AND METHOD FOR PROVIDING SAME

FIELD OF THE INVENTION

This invention relates in general to the field of radio frequency apparatus, in particular to radio frequency filters and more particularly to radio frequency filters employing surface acoustic wave devices.

BACKGROUND OF THE INVENTION

There is an ongoing need for component miniaturization in radio communication devices. For example, smaller and more efficient components are needed for light-weight, hand-portable cellular telephones, wireless local area networks for linking computer systems within office buildings in a readily reconfigurable fashion, pager devices and other devices for promoting rapid, efficient and flexible voice and data communication.

Filters are needed for a variety of such communications applications wherein small size, light weight and high performance are simultaneously required. Increasing numbers of products seek to employ fixed spectral resources, often to achieve tasks not previously envisioned. Examples include cellular telephones, computer and ancillary equipment linkages as well as a host of other, increasingly complex personal or equipment information sharing requirements. The desire to render increasingly complicated communications nodes portable places extreme demands on filtering technology in the context of increasingly crowded radio frequency resources.

Surface acoustic wave (SAW) ladder filters used in duplexers are a popular choice for radios because of their better performance and small size. However, a small device such as a SAW duplexer is required to handle relatively high power levels. For example, a standard specification for a SAW duplexer requires the duplexer to be able to handle 1 watt of power for a lifetime of 50,000 hours. However, existing SAW technologies have had a difficult time meeting this requirement due to the high power densities involved.

One prior art method of addressing the power handling problem included providing a three layer electrode metallization consisting of a first layer of an aluminum-copper alloy, a second layer of pure copper, and a third layer of another aluminum-copper alloy. However, this method has the drawbacks of proving is difficult to etch, being susceptible to corrosion, and requiring an additional annealing step at 400° C.

Another prior art method includes depositing a single-crystal electrode of an aluminum-titanium alloy at one time using an ion beam sputtering technique. However, ion beam sputtering is a slow process, as is known in the art, and is not suitable for mass production.

Associated prior art relating to flat panel display technology has used a layer of aluminum on a layer of titanium. This was done to control electromigration. However, this technology requires the further deposition of a dielectric film on the metal layer, a preheating step of over 300° C., and a glass substrate which is critical in defining the metallization thickness.

What is needed is a method to provide electrode metallization for a SAW device which provides good mechanical strength, stable frequency response, long lifetime at rated power, has good adhesion to a piezoelectric substrate, and is easily mass produced at a low cost.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference characters refer to similar items throughout the figures, and:

The exemplification set out herein illustrates a preferred embodiment of the invention in one form thereof, and such exemplification is not intended to be construed as limiting in any manner.

DETAILED DESCRIPTION OF THE PREFERRED EMBODIMENT

The present invention provides electrode metallization for a SAW device which provides good mechanical strength, a stable frequency response, long lifetime at or above rated power, and good adhesion. Advantageously, the present invention can be easily mass produced with standard processing techniques at a low cost.

Figure 1:
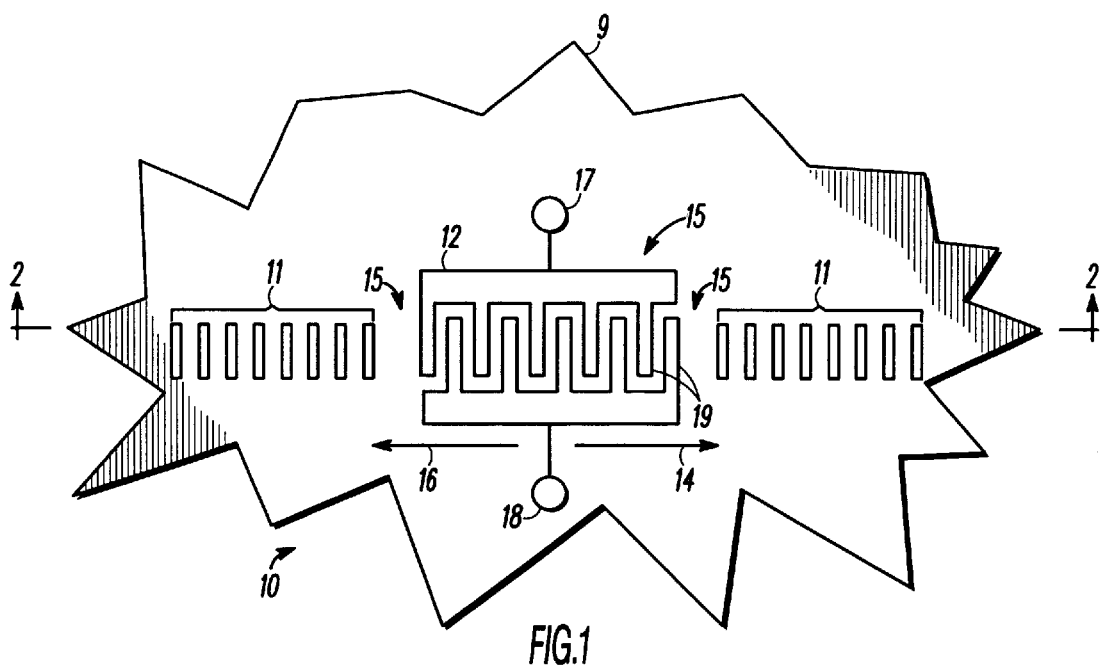
FIG. 1 shows a plan view of a SAW resonator having interdigitated electrodes on a piezoelectric substrate, in accordance with the present invention.

FIG. 1 is a simplified plan view of an acoustic wave resonator 10 including an acoustic wave transducer 13 comprising interdigitated electrodes 19 (also referred to herein an "fingers", "finger electrodes", etc.) coupled alternately to a first terminal 17 or a second terminal 18 via respective bus bars 12. The resonator 10 optionally includes reflectors 11 disposed to either side of the transducer 13 in principal directions 14, 16 of acoustic wave propagation. The reflectors 11 typically comprise metal electrodes analogous to electrodes 19 that are either electrically isolated one from another or coupled to only one of the bus bars 12 within a particular reflector 11 or which may be electrically connected together within a particular reflector 11 but not electrically connected to features outside of that particular reflector 11.

The interdigitated electrodes 19 typically are periodic and define a particular acoustic wavelength at which the transducer 13 exhibits a characteristic acoustic center frequency together with a center frequency wavelength for the acoustic energy transduced in response to electrical stimulation of an appropriate frequency applied via terminals 17, 18. The interdigitated electrodes 19 are usefully one-fourth of this center frequency wavelength wide, i.e., measured along directions in accordance with design principles and performance objectives for the resonator 10. The electrodes are disposed on one-half acoustic wavelength centers, usually alternately coupled to their associated bus bars 12, respectively, and directions are carefully aligned with a preferred crystallographic axis 14, 16 providing the desired acoustic transduction, propagation and reflection characteristics as is known in the art.

Electrical stimulation at an appropriate frequency supplied from electrical terminals 17, 18 to bus bars 12 and thence to the interdigitated or interleaved electrodes 19 results in acoustic waves being generated within transducer 13. Similarly, acoustic waves of an appropriate frequency impinging upon electrodes 19 result in electrical signals being manifested at terminals 17, 18. As used herein, the term "acoustic wavelength" is taken to mean an acoustic wavelength at the filter center frequency, i.e., in the nominal center of the filter passband.

The reflectors 11 typically include electrodes or other reflective structures one-fourth of this wavelength wide, i.e., measured along directions 14, 16, because electrodes of this width tend to be reflective. However, other widths providing suitable reflection characteristics may be employed and this width may be chosen to accommodate the reflection characteristics of the materials employed for the resonator 10, including a substrate 9.

Prior art resonators have typically been fabricated on polished substrate by depositing and patterning a thin aluminum film by techniques similar to those employed in integrated circuit manufacturing and as is know in the art to include wet etching and dry etching. Such resonators can be used in filter devices and duplexers.

Figure 2:
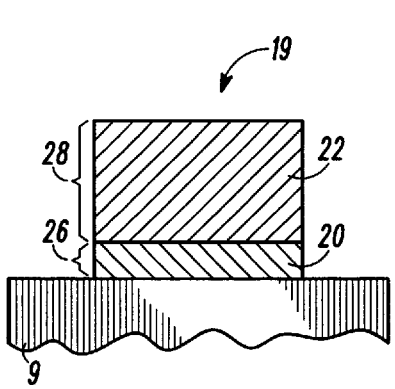
FIG. 2 shows a cross sectional side view of one electrode of a SAW transducer as in FIG. 1, in accordance with a first embodiment the present invention.

FIG. 2 shows a first embodiment of the present invention where each electrode 19 of the SAW device is composed of multiple metallized layers. The surface acoustic wave device including a piezoelectric substrate 9 with metallization disposed thereon and defining interdigitated electrodes 19. The metallization of each interdigitated electrode 19 includes a first layer 20 of substantially pure titanium and a second layer 22 of an alloy of aluminum and titanium wherein titanium comprises about 0.1% to about 1.0% by weight of the alloy with aluminum substantially comprising the remainder of the alloy. There are many types of piezoelectric substrates 9 that can be used equally well for SAW devices. Typical among these are ST-cut quartz, and various angle cuts of lithium niobate, lithium tantalate, lithium tetraborate, etc.

In a preferred embodiment, the first layer 20 has a thickness 26 less than or equal to about 400 Å. Also, in preferred embodiment, the second layer 22 has a thickness 28 of about 2000 Å to 6000 Å. More preferably, the first layer 20 has a thickness 26 of about 200 Å, and the second layer 22 has a thickness 28 of about 4000 Å. In addition, it is preferred that the titanium of the second layer 28 comprises about 0.5% by weight of the alloy, depending on design requirements such as electrical conductivity of the electrode 19.

Figure 3:
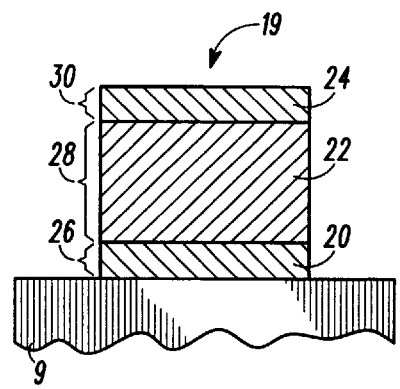
FIG. 3 shows a cross sectional side view of a preferred embodiment of the electrodes of FIG. 2, in accordance with the present invention.
Figure 4:
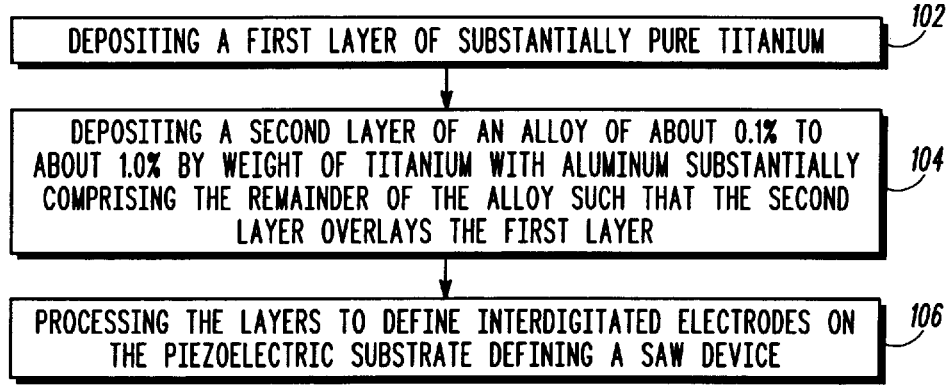
FIG. 4 is a block diagram of a method for providing the electrode metallization of FIG. 2, in accordance with the present invention.

FIG. 3 shows a preferred embodiment of the electrode 19 of FIG. 2, which description is hereby incorporated by reference, which further includes a third layer 24 of substantially pure titanium. Preferably, the third layer 24 has a thickness 30 less than or equal to about 400 Å.

The embodiments of the present invention advantageously utilize metallization layers disposed to have a small grain size so as to provide improved mechanical strength. In particular, the metallization layers are deposited such that the grain size is held at less than 0.3 micrometers, and preferably less than 0.2 micrometers.

The metal layers of the electrode can be realized using sputtering deposition in subsequential events, without breaking vacuum, in a multiple chamber sputtering tool. The metal layers can also be deposited subsequentially with electron-beam deposition in chambers having multiple metal sources. In the latter case the alloy can be formed directly by the simultaneous proportional deposition of pure aluminum and titanium.

The first layer 20 has a thickness of about one-tenth that of the second layer 22 such that the second layer comprises the main body of the electrode 19. The titanium of the first layer 20 enhances the adhesion between the electrode 19 and the substrate 9. Equally important, the titanium promotes preferential Al(111) texture for the aluminum in the second layer 22. Fundamentally, such (111) grain orientation in the so-called "face-centered cubic (fcc)" structured metals results in the highest achievable strength, because dislocation motion on the (111) metallurgical planes is most difficult to occur. The titanium of the first layer 20 also strengthens the entire mechanical structure of the electrode 19 with its foundation of high mechanical strength. The alloying of the second layer 22 is used for better strength due to impurity hardening by fine TiAl3 precipitates and better metallurgical stability than pure aluminum. Metallurgical stability arises from the slowed-down diffusion between the first and second layers 20,22 and from the stable grain boundaries of aluminum in the second layer 22 at the interface between the first and second layers 20,22.

The structure of the present invention described above reduces the failure problem in prior art SAW metallization. SAW metallization failure is due to metal migration caused by high frequency mechanical stress. The mechanical stress is induced by acoustic wave propagation in the SAW device. The present invention improves adhesion and mechanical strength of the electrode thereby redusing the possibility of metallization failure. Moreover, the use of a third layer 24 has the further advantages of preventing materials migration via the surface and hillock formation of the electrode. The thickness 30 of the third layer 24 is kept small to retain reasonable conductivity in the electrode.

The present invention also includes a method 100 of providing electrode metallization on a piezoelectric substrate to form a surface acoustic wave device. The method 100 includes a first step 102 of depositing a first layer of substantially pure titanium onto the substrate. A second step 104 includes depositing a second layer of an alloy of aluminum and titanium, where the titanium comprises about 0.1% to about 1.0% by weight of the alloy with aluminum substantially comprising the remainder of the alloy. The second step 104 provides depositing the second layer such that it overlays the first layer. A last step includes processing the layers to define interdigitated electrodes on the piezoelectric substrate defining the surface acoustic wave device.

Preferably, the step of depositing a first layer includes the first layer being deposited to less than or equal to about 400 Å. It is also preferred that the step of depositing a second layer includes the second layer being deposited to about 2000 Å to 6000 Å in thickness. More preferably, the step of depositing a first layer includes the first layer being deposited to about 200 Å, and the step of depositing a second layer includes the second layer being deposited to about 4000 Å in thickness. The total thickness of the electrode should be determined in accordance with the design requirements on the device performance.

In a preferred embodiment, the step of depositing a second layer includes the alloy having titanium comprising about 0.5% by weight of the alloy. Also, it is preferred that before the processing step a step of depositing a third layer of substantially pure titanium to overlay the second layer is included. Preferably, the depositing a third layer step includes the third layer being deposited to less than or equal to about 400 Å in thickness. More preferably, the depositing a third layer step includes the third layer being deposited to about 200 Å in thickness.

Also in a preferred embodiment, the depositing steps are performed by sputter deposition such that a small grain size is produced resulting in improved mechanical strength. RF and DC sputtering are both viable processes to accomplish this. In particular, the depositing steps are performed so as to produce grain sizes less than 0.3 micrometers. More preferably, the depositing steps are performed so as to produce grain sizes less than 0.2 micrometers.

In practice, the present invention is best utilized in a SAW duplexer for a radio communication device, inasmuch as the duplexer transmits the power transmissions of the radio communication device. Typical radio communication devices, such as cellular phones, transmit signals at up to 1 watt of power. A typical duplexer is expected to have a lifetime of 50,000 hours at this power level. This is very difficult to test due to the extreme length of time. Therefore, it is necessary to perform accelerated life testing of SAW duplexers. Fortunately SAW devices are readily amenable to acceleration testing since the acoustic waves in SAW devices cause large mechanical stresses at relatively low power levels.

EXAMPLE

An experiment was conducted to test the lifetime of SAW duplexers using several different metallizations for the interdigitated electrodes of the SAW tranducers. All the devices were configured similarly on a substrate of 36° Y-X LiTaO$_3$ with the exception of differences in the composition of the metallization. All films were deposited using standard DC magnetron sputtering techniques. Also, all of the samples were deposited with films having a total thickness of about 4500 Å, and were etched using a standard reactive ion etch process.

A first sample was made of a prior art SAW filter with electrodes of pure aluminum. A second sample was made of a prior art SAW filter with a single layer electrode of Al(0.5% Ti) alloy. A third sample was made of a SAW filter with electrodes having a first layer of titanium and a second layer of Al(0.5% Ti) alloy, in accordance with the present invention (see FIG. 2). All the samples were tested under power and the frequency response and insertion loss of each device was measured at many time intervals. The time for the insertion loss of the device to degrade 0.5 dB was calculated from the measurements.

Figure 5:
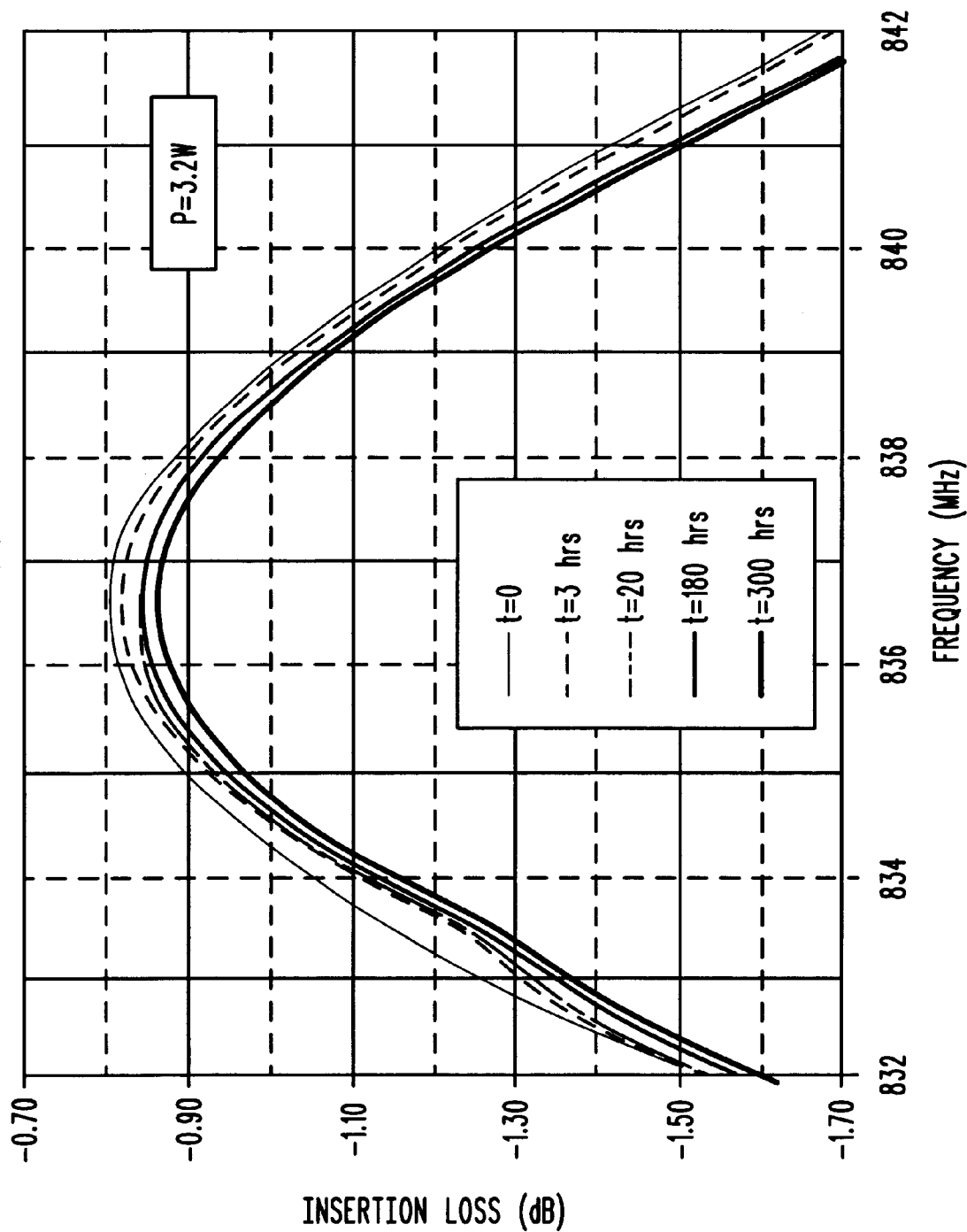
FIG. 5 shows a graphical representation of frequency response changes over time and at power for the electrode configuration of FIG. 2.

FIG. 5 shows the measured frequency response of one device from the third sample having a first layer of titanium and a second layer of Al(0.5% Ti) alloy, in accordance with the present invention (see FIG. 2). As can be seen, after 300 hours of testing at a power level of 3.2 watts, the insertion loss degraded by 0.06 dB. The projected lifetime (0.5 dB degradation) of this device is thus determined to be about 2500 hours at this power level. It should also be noted that the center frequency of this device did not shift over the testing period, which is a critical performance requirement.

As is know in the art, the expected lifetime (that period of time needed for insertion loss to degrade 0.5 dB) of a device can be empirically determined by the relation:

$$(t/t_0) = (P/P_0)^{-6} \qquad (1)$$

where $t_0$ and $P_0$ are tested references of lifetime and power. For the device tested for FIG. 5 this equation thus becomes $$(t/2500 \text{ hours}) = (P/3.2 \text{ watts})^{-6}$$

Therefore, at 1 watt of power, the expected lifetime of this particular device, made in accordance with the present invention, is about 2.7 million hours. This is much higher than the target specification lifetime of 50,000 hours at one watt.

Figure 6:
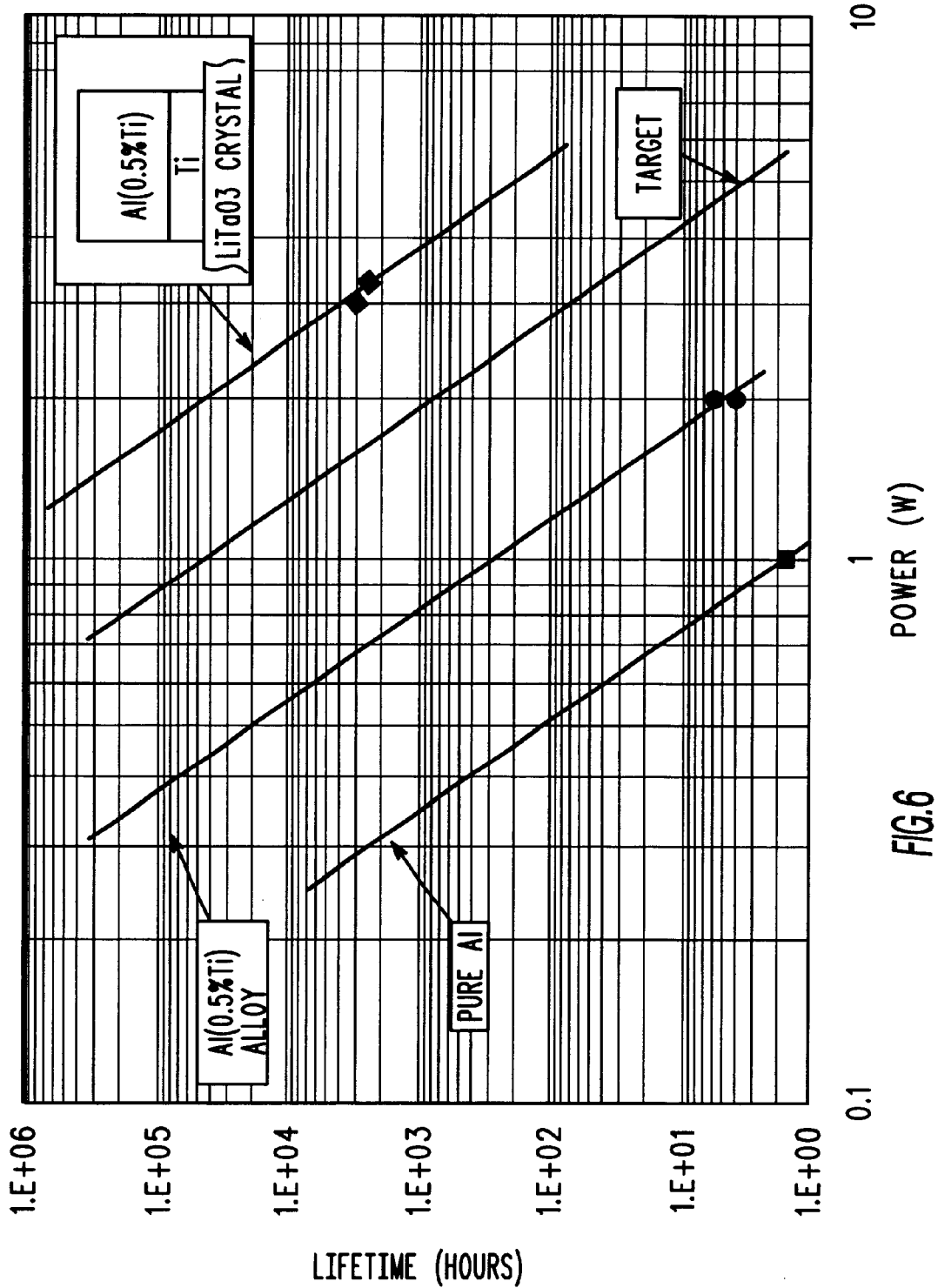
FIG. 6 shows a graphical representation of lifetime testing results of several SAW metallization configurations under power.

FIG. 6 shows Eq. 1 plotted for the three samples and a target curve for comparison. The target curve is plotted for the specification of 50,000 hours at one watt. It is desired to provide SAW devices that perform above this line in order to meet the desired performance requirements of a typical radio device.

The first sample of the prior art SAW device having electrodes of pure aluminum had a tested lifetime of two hours at one watt. The predicted lifetime line was plotted from this point. As can be seen, pure aluminum electrodes are not sufficient to meet the required power/lifetime specification. The second sample (two devices) of a prior art SAW filter with single layer electrodes of Al(0.5% Ti) alloy had a tested lifetime of about five hours at two watts. The predicted lifetime line was plotted from this point. As can be seen, these devices would only last about 300 hours at a one watt power level. This is still not sufficient to meet the required power/lifetime specification.

Work has also been done with aluminum-copper alloys (see Tokihiro et al., Improved Power Durability of Surface Acoustic Wave Filters for Antenna Duplexers, Jpn, J. Appl. Phys. Vol. 34 (1995) pp. 2688–2692, Part 1, No. 5B, May 1995) where a lifetime of about 40,000 hours at one watt has been report. However, this still falls short of the required radio specification.

The third sample (two devices) of SAW filters made in accordance with the present invention had a tested lifetime of about almost three thousand hours at over three watts. The predicted lifetime line was plotted from this point. As can be seen, this sample easily exceeds the power/lifetime specification.

Thus, an acoustic filter device has been described which overcomes specific problems and accomplishes certain advantages relative to prior art methods and mechanisms. The improvements over known technology are significant. The problems of prior art filters are avoided. Further, improved drive level lifetime is realized for low cost filters together with ease of manufacturability. It should be recognized that the above description is only used as an example and is in no way limiting.

The foregoing description of the specific embodiments so fully reveals the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the broad scope of the appended claims.

What is claimed is:

1. A method of providing electrode metallization on a piezoelectric substrate to form a surface acoustic wave device, comprising the steps of:

depositing a first layer of substantially pure titanium onto the substrate;

depositing a second layer of an alloy of aluminum and titanium, wherein titanium comprises about 0.1% to about 1.0% by weight of the alloy with aluminum substantially comprising the remainder of the alloy such that the second layer overlays the first layer; and processing the layers to define interdigitated electrodes on the piezoelectric substrate defining the surface acoustic wave device.

2. The method of claim 1, wherein the depositing a second layer includes the alloy having titanium comprising about 0.5% by weight of the alloy.

3. The method of claim 1, wherein the depositing a first layer includes the first layer being deposited to less than or equal to about 400 Å.

4. The method of claim 1, wherein the depositing a second layer includes the second layer being deposited to about 2000 Å to 6000 Å in thickness.

5. A method of providing electrode metallization on a piezoelectric substrate to form a surface acoustic wave device, comprising the steps of:

depositing a first layer of substantially pure titanium onto the substrate;

depositing a second layer of an alloy of aluminum and titanium, wherein titanium comprises about 0.1% to about 1.0% by weight of the alloy with aluminum substantially comprising the remainder of the alloy such that the second layer overlays the first layer;

depositing a third layer of substantially pure titanium to overlay the second layer and processing the layers to define interdigitated electrodes on the piezoelectric substrate defining the surface acoustic wave device.

6. The method of claim 5, wherein the depositing a third layer step includes the third layer being deposited to less than or equal to about 400 Å in thickness.

7. The method of claim 1, wherein the depositing steps are performed by sputter deposition such that a small grain size is produced resulting in improved mechanical strength.

8. The method of claim 1, wherein the depositing steps are performed so as to produce grain sizes less than 0.3 micrometers.

9. A surface acoustic wave device including a piezoelectric substrate with metallization disposed thereon and defining interdigitated electrodes, the metallization of the interdigitated electrodes comprising:

a first layer of substantially pure titanium; and a second layer of an alloy of aluminum and titanium wherein titanium comprises about 0.1% to about 1.0% by weight of the alloy with aluminum substantially comprising the remainder of the alloy.

10. The surface acoustic wave device of claim 9, wherein the titanium of the second layer comprises about 0.5% by weight of the alloy.

11. The surface acoustic wave device of claim 9, wherein the first layer is less than or equal to about 400 Å in thickness.

12. The surface acoustic wave device of claim 9, wherein the second layer is about 2000 Å to 6000 Å in thickness.

13. A surface acoustic wave device including a piezoelectric substrate with metallization disposed thereon and defining interdigitated electrodes, the metallization of the interdigitated electrodes comprising:

a first layer of substantially pure titanium;

a second layer of an alloy of aluminum and titanium wherein titanium comprises about 0.1% to about 1.0% by weight of the alloy with aluminum substantially comprising the remainder of the alloy; and a third layer of substantially pure titanium.

14. The surface acoustic wave device of claim 13, wherein the third layer is less than or equal to about 400 Å in thickness.

15. The surface acoustic wave device of claim 9, wherein the layers of the metallization are disposed to have a small grain size so as to provide improved mechanical strength.

16. The surface acoustic wave device of claim 15, wherein the grain size is less than 0.3 micrometers.

17. A duplexer for a radio communication device, the duplexer incorporating a surface acoustic wave device including a piezoelectric substrate with metallization disposed thereon and defining interdigitated electrodes, the metallization of the interdigitated electrodes comprising:

a first layer of substantially pure titanium; and a second layer of an alloy of aluminum and titanium wherein titanium comprises about 0.1% to about 1.0% by weight of the alloy with aluminum substantially comprising the remainder of the alloy.

* * * * *